US007257137B2

(12) United States Patent
Robbins et al.

(10) Patent No.: US 7,257,137 B2
(45) Date of Patent: Aug. 14, 2007

(54) TUNEABLE LASER HAVING COMB REFLECTORS PRODUCING COMBS OF REFLECTIVE WAVELENGTH PEAKS

(75) Inventors: David James Robbins, Northants (GB); Peter John Williams, Northants (GB)

(73) Assignee: Bookham Technology, PLC, Towcester (GB)

( * ) Notice: Subject to any disclaimer, the term of this patent is extended or adjusted under 35 U.S.C. 154(b) by 316 days.

(21) Appl. No.: 10/483,943

(22) PCT Filed: Jul. 15, 2002

(86) PCT No.: PCT/GB02/03239

§ 371 (c)(1), (2), (4) Date: Jun. 21, 2004

(87) PCT Pub. No.: WO03/009434

PCT Pub. Date: Jan. 30, 2003

(65) Prior Publication Data

US 2004/0240490 A1 Dec. 2, 2004

(30) Foreign Application Priority Data

Jul. 14, 2001 (GB) ................................ 0117224.6

(51) Int. Cl.
*H01S 3/10* (2006.01)
*H01S 3/08* (2006.01)

(52) U.S. Cl. ............................ 372/20; 372/20; 372/92; 372/96

(58) Field of Classification Search .................. 372/20, 372/96
See application file for complete search history.

(56) References Cited

U.S. PATENT DOCUMENTS 4,885,753 A * 12/1989 Okai et al. ............... 372/45.01
4,896,325 A 1/1990 Coldren
5,216,680 A * 6/1993 Magnusson et al. .......... 372/20

(Continued)

FOREIGN PATENT DOCUMENTS

EP 0 559 192 A 9/1993

(Continued)

OTHER PUBLICATIONS

Roh, S.D. et al.: "Dual-Wavelength Asymmetric Cladding INGAAS-GAAS Ridge Waveguide Distributed Bragg Reflector Lasers", IEEE Photonics Technology letters, IEEE Inc., New York, USA, vol. 11, No. 1, Jan. 1999, pp. 15-17,XP 000801377, ISSN: 1041-1135.

(Continued)

*Primary Examiner*—Minsun Oh Harvey
*Assistant Examiner*—Phillip Nguyen
(74) *Attorney, Agent, or Firm*—Lahive & Cockfield, LLP; Anthony A. Laurentano, Esq.

(57) ABSTRACT

A tuneable laser is disclosed, including a gain section with first and second comb reflectors to one side thereof. The two reflectors each provide combs with substantially uniform spacings, the spacings differing as between the combs. Each comb reflector can be tuned so as to shift the reflective peaks of the combs, thus allowing alignment of a single reflective peak at a chosen wavelength which is the same in both combs, forming a supermode. This supermode has an intensity greater than the threshold of the gain section and thus the laser produces an output at that selected wavelength.

16 Claims, 5 Drawing Sheets

U.S. PATENT DOCUMENTS

| | | | | |
|---|---|---|---|---|
| 5,581,572 | A * | 12/1996 | Delorme et al. | 372/50.11 |
| 5,748,660 | A * | 5/1998 | Delorme et al. | 372/50.11 |
| 5,838,714 | A * | 11/1998 | Delorme | 372/96 |
| 6,687,267 | B2 * | 2/2004 | Bukkems | 372/20 |
| 6,822,981 | B2 * | 11/2004 | Jacquet | 372/20 |
| 7,145,923 | B2 * | 12/2006 | Carter et al. | 372/20 |
| 2002/0054614 | A1 * | 5/2002 | Jin | 372/20 |
| 2003/0086448 | A1 * | 5/2003 | Deacon | 372/20 |
| 2004/0125833 | A1 * | 7/2004 | Sarlet et al. | 372/20 |
| 2004/0151215 | A1 * | 8/2004 | Reid et al. | 372/20 |

FOREIGN PATENT DOCUMENTS

| | | |
|---|---|---|
| EP | 0 825 689 A | 2/1998 |
| EP | 1 258 955 A | 11/2002 |
| GB | 2 197 531 A | 5/1988 |
| GB | 2 303 739 A | 2/1997 |
| GB | 2 371 920 A | 8/2002 |
| JP | 09 148684 A | 2/1998 |

OTHER PUBLICATIONS

Mason B. et al.: "Widely Tunable Samples Grating DBR Laser with Integrated Electroabsorption Modulator" IEEE Photonics Technology Letters, IEEE Inc., New York, USA, vol. 11, No. 6, Jun. 1999, pp. 638-640, XP000835422, ISSN: 1041-1135.

* cited by examiner

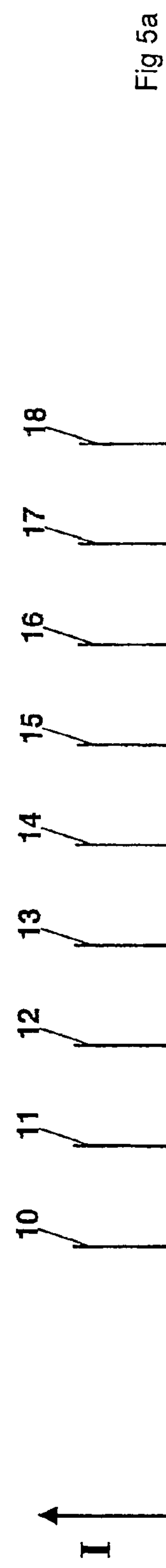
Fig 5b
20 21 22 23 24 25 26 27 28
I
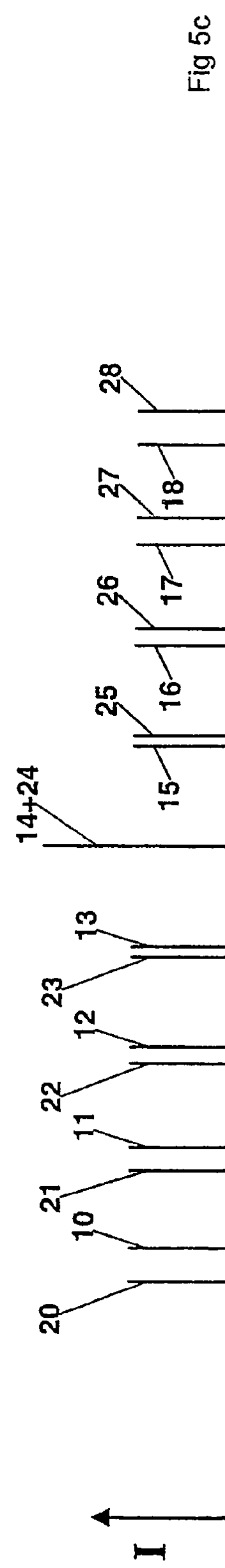
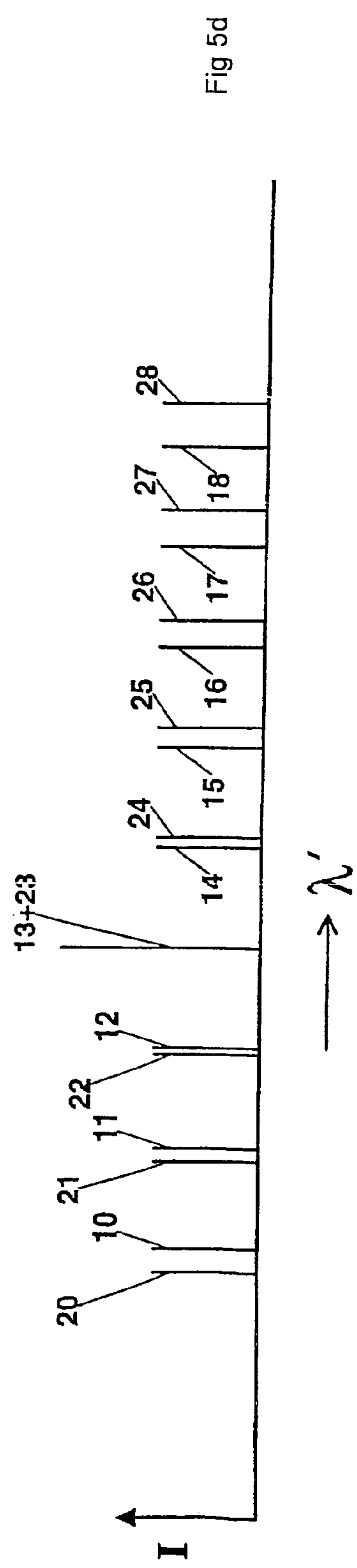

TUNEABLE LASER HAVING COMB REFLECTORS PRODUCING COMBS OF REFLECTIVE WAVELENGTH PEAKS

RELATED APPLICATIONS

This application is a 35 U.S.C. 371 national stage filing of International Application No. PCT/GB02/03239, filed 15 Jul. 2002, which claims priority to Great Britain Patent Application No. 0117224.6 filed on 14 Jul. 2001, in Great Britain. The contents of the aforementioned applications are hereby incorporated by reference.

This invention relates to tuneable lasers and has particular, but not necessarily exclusive, reference to tuneable lasers for use in telecommunications systems operating in the C-band, namely within the band of 1530 to 1570 nm.

BACKGROUND TO THE INVENTION

In this specification the term "light" will be used in the sense that it is used in optical systems to mean not just visible light but also electromagnetic radiation having a wavelength between 1000 nanometers (nm) and 3000 nm.

Single wavelength lasers are important for a number of applications in optical telecommunications and signal processing applications. These include multiple channel optical telecommunications networks using wavelength division multiplexing (WDM). Such networks can provide advanced features, such as wavelength routing, wavelength conversion, adding and dropping of channels and wavelength manipulation in much the same way as in time slot manipulation in time division multiplexed systems. Many of these systems operate in the C-band in the range 1530 to 1570 nm.

Tuneable lasers for use in such optical communications systems, particularly in connection with the WDM telecommunication systems, are known. A known tuneable system comprises stacks of single wavelength distributed Bragg reflectors (DBR) lasers, which can be individually selected, or tuned over a narrow range, or by a wide tuning range tuneable laser that can be electronically driven to provide the wavelength required.

Limited tuning range tuneable lasers that rely upon thermal effects for tuning are also known.

U.S. Pat. No. 4,896,325 discloses a wavelength tuneable laser having sampled gratings at the front and rear of its gain region. The gratings produce slightly different reflection combs, which provide feedback into the device. The gratings can be current tuned in wavelength with respect to each other. Coincidence of a maximum from each of the front and rear gratings is referred to as a supermode. To switch the device between supermodes requires a small incremental electrical current into one of the gratings to cause a different pair of maxima to coincide in the manner of a vernier. By applying electrical currents to the two gratings so that the corresponding maxima track, continuous tuning within a supermode can be achieved.

In summary, for a given set of drive currents in the front and rear grating sections, there is a simultaneous correspondence in reflection peak at only one wavelength, as a consequence of which the device lases at that wavelength. To change that wavelength a different current is applied to the front and rear gratings. Thus the front and rear gratings operate in a vernier mode, in which the wavelengths of correspondence determine a supermode wavelength.

In practice the reflection spectrum of the known sampled grating structures have a Sinc squared envelope which limits the total optical bandwidth over which the lazer can reliably operate as a single mode device.

An improved form of selective grating is the phase grating, as described in UK patent specification 2 337 135, the contents of which are incorporated herein by way of reference.

The term "phase grating" as used herein is used to describe and define a selectively reflecting distributed Bragg grating which is constructed and operates in the manner described and claimed in Patent specification 2 331 135. In other words, a phase grating is one in which the grating structure comprises a plurality of repeat gratings in which each grating unit comprises a series of adjacent diffraction gratings having the same pitch, and is characterised in that the grating units and adjacent gratings within a grating unit are separated by a phase change of substantially pi ($\pi$) radians and in which at least two of the gratings within a grating unit have different lengths, the lengths being selected so as to provide a predetermined reflection spectrum.

Details on the construction and operation of the phase grating are to be found in UK Patent specification 2 337 135.

A significant difference between the comb of reflection wavelength peaks produced by a phase grating distributed Bragg reflector (PG-DBR) as compared to a sampled grating distributed Bragg reflector (SG-DBR) is that the reflection peaks of a PG-DBR are all substantially of the same height, in other words the reflection peaks are all substantially of the same intensity.

BRIEF SUMMARY OF THE INVENTION

By the present invention there is provided a tuneable laser including a gain section, a first comb reflector adapted to produce a first comb of reflective wavelength peaks and a second comb reflector adapted to produce a second comb of wavelength peaks, the spacings between the peaks of the first comb being substantially uniform and being different from the substantially uniform spacings of the peaks in the second comb, the gain section having an associated electrode capable, in use, of passing current selectively through the gain section, characterised in that the gain section has both the first comb reflector and the second comb reflector on the same side, the first comb reflector and the second comb reflector being capable of being tuned, the arrangement being such that, in use tuning causes movement of the first comb of reflective peaks relative to the second comb, so as to cause alignment of a single reflective peak at the same wavelength in both first and second comb so as to form a supermode, sufficient current being capable of being passed through the electrode associated with the gain section to cause the laser to lase at the wavelength of the supermode.

The comb reflectors may have associated electrodes and may be tuned by passing electrical current selectively through the electrodes.

The comb reflectors may be thermally tuneable by the passage of heat therethrough via surface heaters located over the comb reflectors The comb reflectors may be selected from the group: phase gratings and sampled grating distributed Bragg gratings There may be provided a partially reflecting mirror on the side of the gain section opposite to the comb reflectors and the partially reflecting mirror may be non-wavelength selective.

There may be provided a phase change section in the laser between the two comb reflectors and the phase change section may be provided with an electrode capable of passing current selectively through the phase change section.

There may be a phase change section in the laser between the gain section and the first of the comb reflectors and the phase change section between the gain section and the first of the comb reflectors may be provided with an electrode capable of passing current selectively through that phase change section.

Current may be passed through both phase gratings at the same time so as to cause a fine-tuning of the wavelength of operation of the laser by movements of the supermode between peaks.

Simultaneously with the fine-tuning of the wavelength peak current may be passed through one or both of the phase change sections to maintain a constant optical cavity length for the laser.

There may be provided a plurality of first and second comb reflectors and there may be provided a phase change section between each of the comb reflectors.

There may be provided a totally reflecting mirror on the side of the gain section opposite to the comb reflectors, and there may be further provided a partially reflective mirror at the end of the laser assembly remote from the gain section on the side of the comb reflectors.

Preferably there is parity between the numbers of reflection peaks in all of the combs.

BRIEF DESCRIPTION OF THE DRAWINGS

FIGS. 5*a* to 5*d* are diagrams of the wavelength intensity peaks vs. wavelength.

DESCRIPTION OF THE PREFERRED EMBODIMENTS OF THE INVENTION

The wavelengths of interest referred to above, for example the C-band wavelengths of 1530 to 1570 nm are the wavelengths of light in free space. When such light passes through a medium, of refractive index $n_{eff}$. The actual wavelength of the light within that medium which will be referred to herein as λ', is the wavelength λ divided by the value for the refractive index $n_{eff}$. In other words $$\lambda' = \lambda / n_{eff}.$$

where $n_{eff}$ is the effective refractive index of the medium as seen by the propagating light of wavelength λ in free space.

It so happens that the glass (silica) fibres, which are commonly used in telecommunications systems, have low loss regions at about 1100 nm 1300 nm and 1500 nm. These regions are about 100 nm wide and consequently much work is done on producing lasers that produce light in the low loss bandwidths. The same is true for the tuneable laser of the present invention. The specific examples of the invention are designed to work in the C-Band, but the invention could be used for other wavelengths if required and if new types of fibre optical cables become available.

Figure 1:
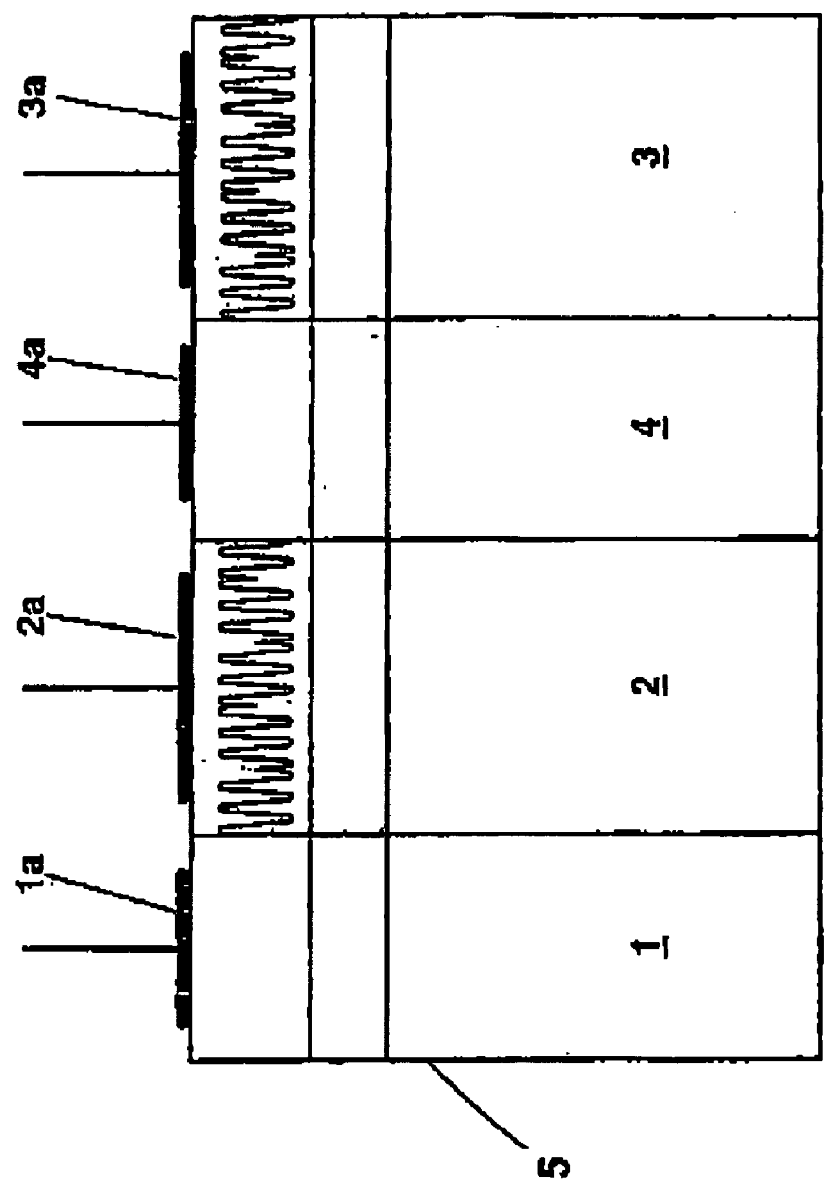
FIG. 1 is a schematic sectional view of one embodiment of the invention.

Referring to FIG. 1, this shows a laser in accordance with the invention and having a gain section 1 a first phase grating 2, and a second phase grating 3. A phase change section 4 separates the two phase gratings 2 and 3. Electrodes 1*a*, 2*a* 3*a*, and 4*a* are located above the gain section 1, the two phase gratings 2 and 3 and the phase change section 4 respectively. A partially reflecting mirror 5 is located on the front of the gain section 1.

The two phase gratings are PG-DBRs in accordance with the description of UK Patent specification 2 337 135. A characteristic of a PG-DBR is that it acts as a DBR which reflects at a plurality of discrete and separated wavelengths so that a graph of wavelength intensity in the vertical direction against wavelength in the horizontal direction produces a comb shape as shown in FIG. 5*a*.

In FIG. 5 the four graphs are all of intensity I vs. wavelength λ' and are positioned one above the other for reasons which will be explained below. Referring firstly to FIG. 5*a*, this shows the wavelength peaks of the phase grating 2. It can be seen that nine peaks or modes 10 to 18 are shown and they are uniformly separated, to form a comb with all of the peaks at the same height. This is a characteristic of a PG-DBR.

It is a useful simplification of the phase correction required if the number of the peaks in the two combs is in parity with one another. In other words if there is an odd number of peaks in one comb it is preferred that there is an odd number in the other comb. Likewise if there is an even number of peaks in one comb then it is preferred that there is an even number in the other comb. It does not need the absolute numbers to be the same, e.g. there could be nine peaks in one comb and either nine or eleven peaks in the other comb. Likewise if one comb has ten peaks the other comb preferably also has an even number but it would not matter if the number were eight or ten or twelve. What is not preferred is an odd number in one comb and an even number in the other, although such an arrangement can be made to work according to the invention.

Immediately below FIG. 5*a* is FIG. 5*b* and this shows the intensity peaks or modes for the wavelengths of phase grating 3. Again nine peaks are shown, and these are referenced 20 to 28. The separation of the peaks 20 to 28 is again uniform, but the individual peak separation for the peaks 20 to 28 is greater than that of peaks 10 to 18. The difference has been exaggerated in the drawing for the sake of clarity. As shown in the drawing, it will be seen that the wavelengths of peaks 14 and 24 coincide. The significance of this will be explained below.

In FIG. 1, to get the laser to lase, it is necessary to have both a population inversion of electron energy states within the gain material of the gain section 1 and to get the gain of at least one, and preferably only one, wavelength to be above the lasing threshold. To create the population inversion sufficient current is passed through electrode 1*a* to obtain the inversion. That light will then be partially reflected by the front mirror 5 and back into the two phase gratings 2 and 3.

It will be assumed that no current has been applied to the electrodes 2*a* and 3*a* and the "at rest" combs of wavelength reflectivities of the phase gratings 2 and 3 are as shown in FIG. 5*a* and FIG. 5*b*. It will be seen that light at the wavelengths corresponding to peaks 10 to 13, 15 to 18, 20 to 23 and 25 to 28 will only be reflected by one of the phase gratings. However light at the wavelength 14 and 24, which is the same wavelength will be reflected by both the phase grating 2 and the phase grating 3. This causes a greater overall reflection at that wavelength as illustrated in FIG. 5*c*. In FIG. 5*c* it can be seen that the light at wavelength 14, which is the same as wavelength 24, is reflected by a significantly greater amount than the remaining peaks and forms a supermode. This means that there will be a selective build up of light at that wavelength, and the laser will lase at that wavelength.

In FIG. 1, if a current is now applied to electrode 2*a*, this causes a lowering of the refractive index of the material in which the phase grating 2 is created. This has the effect of reducing the wavelengths of the whole comb at which phase grating 2 reflects. In effect, this moves the comb of phase grating 2 to the left as seen in FIG. 5*d*. As a result peak 14 now moves to the left of peak 24 and there is no longer formed a supermode peak at that wavelength. However, the peak 13 now moves to line up with peak 23. The result of this is a coincident reflection at that wavelength, and the formation of a supermode peak at that wavelength as shown in FIG. 5*d*. Lasing of the laser then occurs at that wavelength. Whilst electric current causes a lowering of the material refractive index, and thus provides a tuning means, other tuning methods rely upon an increase in material refractive index, as is the case when temperature increase is used as the tuning means.

If more current is passed through electrode 2*a* the peaks 11 and 21 can be brought into alignment to form a supermode at the wavelength of peak 21. With even more current passed through electrode 2*a*, peaks 10 and 20 can be brought into alignment to form a supermode and the laser made to lase at the wavelength of peak 20.

To bring the peaks 15 and 25 into alignment the current through electrode 2*a* is brought back to zero, and current is passed through electrode 3*a*. As more current is passed, the peaks 15 and 25 can be brought into alignment to form a supermode at the wavelength corresponding to peak 15. By this method, the laser can be tuned to the individual peak positions across the entire wavelength band. In effect this is a coarse tuning of the laser from one peak to the next.

To fine tune the laser, and to move the reflecting peak a small amount once the laser has been tuned to a supermode position such as is illustrated in FIG. 5*c*, then additional current is applied at the same time to both of the electrodes 2*a* and 3*a*. This has the effect of moving both combs to the left at the same time, and thus both peaks will move to the left together and thus the supermode peak will move to a shorter wavelength as both combs move together.

When the maximum amount of reduction in refractive index of the material in which the phase grating is created has occurred, no more fine tuning can take place, and it is necessary to move to the next adjacent super-mode peak and start again. The maximum practical movement of the reflective peaks by refractive index variation is about 10 nm, and so about seven different peaks would need to be produced for the tuning across the whole of the 40 nm between 1530 nm and 1570 nm in the C-band.

When the fine-tuning is in action, it has the effect of reducing the optical cavity length of the laser. To counteract this, a phase change section 4 operated by electrode 4*a* is provided as shown in FIG. 1. As the laser is fine tuned, a current is passed through electrode 4*a* and this has the effect of reducing the refractive index of the material in the phase change section so as to counteract the change in the cavity section occurring as the position of the super-mode peak is altered within the laser.

It may be desirable to provide the phase change section 4, even if it does not have an electrode 4*a*. This is because it may be desirable to have a phase change between the phase gratings 2 and 3 and a passive phase change section could be used to accomplish this.

Figure 2:
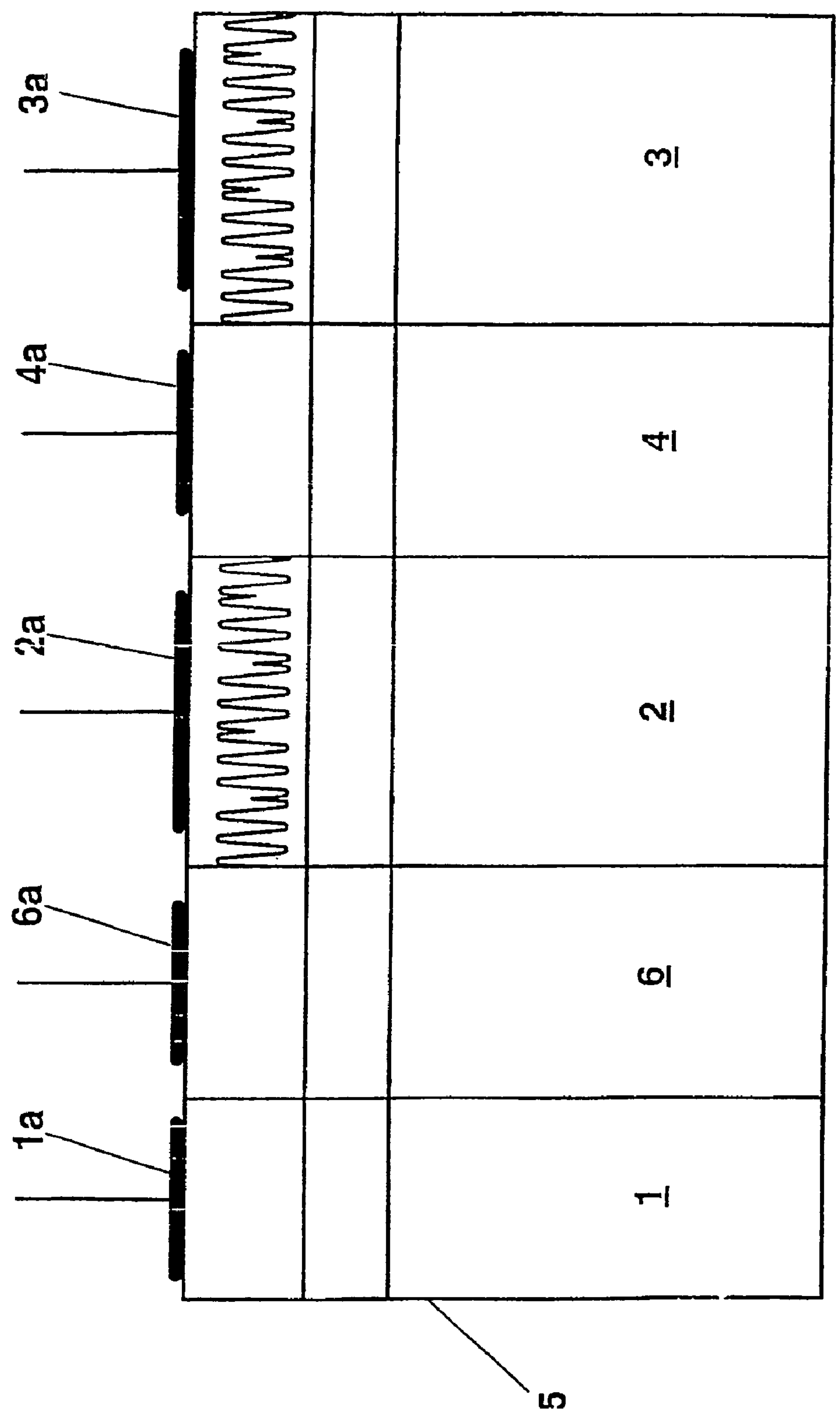
FIG. 2 is a schematic sectional view of a second embodiment of the invention.

In a second embodiment of the invention as illustrated in FIG. 2, the laser is effectively the same as in the embodiment shown in FIG. 1, except that it has a second phase change section 6 with an associated electrode 6*a* located between the gain section 1 and the first phase grating 2. All other parts are the same and have the same reference numerals. The laser operates and is tuneable in the same manner as for the laser shown in FIG. 1, but the additional phase change section 6 permits the individual tuning of the phase sections 2 and 3.

Figure 3:
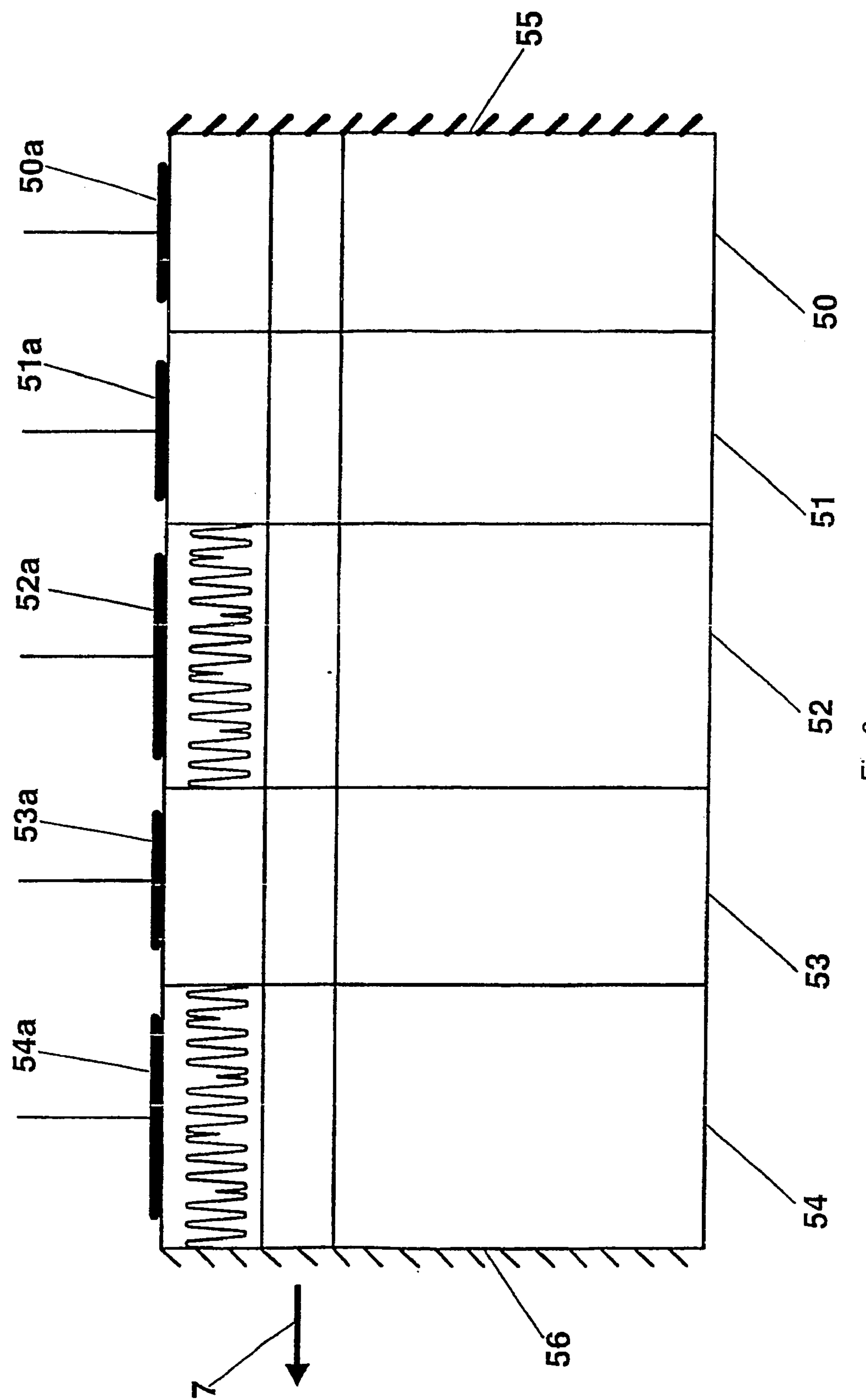
FIG. 3 is a schematic sectional view of a third embodiment of the invention.

In the third embodiment as illustrated in FIG. 3, the laser has a gain section 50 adjacent to which is a phase change section 51. A first comb reflector 52 in the form of a sampled grating distributed Bragg reflector is located adjacent the phase change section 51 and a further phase change section 53 is located between the first comb reflector 52 and a further comb reflector SG-DBR 54. A fully reflecting mirror is located on the surface 55 and a partially reflecting mirror is located on the surface 56. Electrodes 50*a* to 54*a* are located over the constituent parts 50 to 54 to enable current to be injected into the portions 50 to 54 of the laser below their respective electrodes.

The laser functions in the same manner as the laser illustrated in FIG. 1, except that light generated by the gain section 50 is fully reflected by mirror 55 and when the comb reflectors are tuned to reflect and reinforce at a single wavelength as shown in FIG. 5, the light emerges from the laser through the partially reflecting mirror as at 57.

Figure 4:
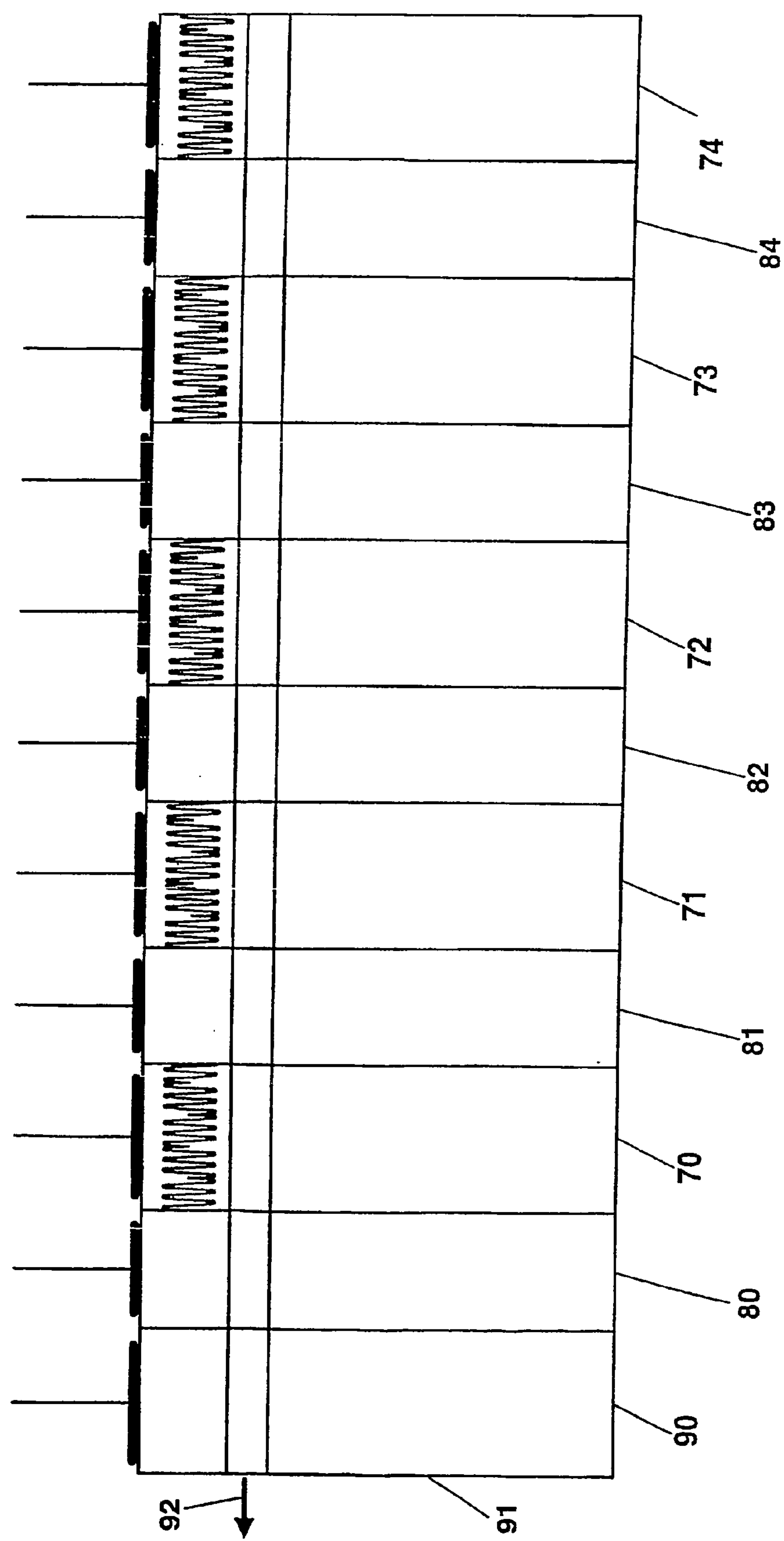
FIG. 4 is a schematic sectional view of a fourth embodiment of the invention.

In an alternative form of the invention as shown in FIG. 4, there is provided a plurality of sampled grating elements 70 to 74 which can either be SG-DBRs or phase gratings and each can have an associated phase change section 80 to 84, with the gain section 90 on the left hand side of the laser at the front so that there would be provided a partially reflecting face 91 on the outside of the laser and the light would emerge from the laser in the direction of the arrow 92

In FIG. 1 the phase control sections ensure that the laser can be tuned to a single longitudinal mode by adjusting the optical cavity length between the partially reflective mirror 5, and the phase grating 2, and in FIG. 2 between the two phase gratings 2 and 3. In all embodiments of the invention the reflections from the involved comb reflectors interact additively at the supermode and as the supermode is fine-tuned. This is aided by ensuring that the phase section between the two comb reflectors is driven with current to achieve an appropriate path length so that mode hopping does not occur.

The device shown in FIG. 1 would work over a few supermodes if sampled gratings were used but the toning range would be less, and probably limited to two supermode spacings.

The comb reflector could be any suitable reflector capable of generating a comb reflection response. Phase gratings are only one example of ways to produce a comb response Bragg reflector. There are others such as the Segmented Grating already discussed, plus examples given in U.S. Pat. No. 5,325,392 Tohmori et al, FIGS. 3 and 4. In principle any of these comb reflectors could be used in place of the phase gratings defined for the invention.

The tuning means has been described solely as by tuning current. There are other ways to produce tuning for example by using heat—e.g. thermal effects via surface heaters over the phase gratings and electro refraction—electrical field tuning by driving the phase gratings in reverse bias to vary the refractive index, as opposed to the normal forward bias mode where current is injected into the structure.

The invention claimed is:

1. A tuneable laser, comprising a cavity having first and second reflective ends, a gain section located within the cavity, the first reflective end comprising first and second comb reflectors, the first comb reflector being adapted to produce a first comb of reflective wavelength peaks and the second comb reflector being adapted to produce a second comb of wavelength peaks, the spacings between the peaks of the first comb being substantially uniform and being different from the substantially uniform spacings of the peaks in the second comb, the gain section having an associated electrode capable, in use, of passing current selectively through the gain section, wherein the gain section has both the first comb reflector and the second comb reflector on the same side, the first comb reflector and the second comb reflector being capable of being tuned such that, in use, tuning causes movement in wavelength of the reflective peaks of the first comb relative to those of the second comb so as to cause alignment of a single reflective peak at the same wavelength in both the first and second combs to form a supermode, at which wavelength the gain section can cause the laser to lase.

2. A tuneable laser as claimed in claim 1, wherein the first and second comb reflectors have associated electrodes and are tuned by passing electrical current selectively through the electrodes.

3. A tuneable laser as claimed in claim 1, wherein the first and second comb reflectors are thermally tuneable by the passage of heat therethrough via surface heaters located over the comb reflectors.

4. A tuneable laser as claimed in claim 1, wherein the first and second comb reflectors are one of a phase grating and a sampled grating distributed Bragg grating.

5. A tuneable laser as claimed in claim 1, further comprising a partially reflecting mirror on a side of the gain section opposite to the first and second comb reflectors.

6. A tuneable laser as claimed in claim 5, wherein the partially reflecting mirror is non-wavelength selective.

7. A tuneable laser as claimed in claim 1, further comprising a phase change section disposed between the first and second comb reflectors.

8. A tuneable laser as claimed in claim 7, wherein the phase change section includes an electrode capable of passing current selectively through the phase change section.

9. A tuneable laser as claimed in claim 1, further comprising a phase change section disposed between the gain section and the first comb reflector.

10. A tuneable laser as claimed in claim 9, wherein the phase change section between the gain section and the first comb reflector includes an electrode capable of passing current selectively through that phase change section.

11. A tuneable laser as claimed in claim 1, wherein current is passed through the first and second comb reflectors at the same time so as to cause a fine-tuning of the wavelength of operation of the laser by movement of the supermode between peaks.

12. A tuneable laser as claimed in claim 11, wherein simultaneously with the fine-tuning of the wavelength peak, current is passed through one or more phase change sections to maintain a constant optical cavity length for the laser.

13. A tuneable laser as claimed in claim 1, further comprising a plurality of first and second comb reflectors.

14. A tuneable laser as claimed in claim 13, further comprising a phase change section disposed between each of the first and second comb reflectors.

15. A tuneable laser as claimed in claim 1, further comprising a totally reflecting mirror on a side of the gain section opposite to the first and second comb reflectors, and partially reflective mirror at an end of the laser remote from the gain section on the side of the first and second comb reflectors.

16. A tuneable laser as claimed in claim 1, wherein there is parity between the numbers of reflection peaks in the first and second combs.

* * * * *